(12) United States Patent
Hatcher et al.

(10) Patent No.: US 11,217,392 B2
(45) Date of Patent: Jan. 4, 2022

(54) COMPOSITE PIEZOELECTRIC CAPACITOR

(71) Applicant: Samsung Electronics Co., Ltd., Suwon-si (KR)

(72) Inventors: Ryan M. Hatcher, Austin, TX (US); Titash Rakshit, Austin, TX (US); Jorge A. Kittl, Austin, TX (US); Joon Goo Hong, Austin, TX (US); Dharmendar Palle, Austin, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/417,346

(22) Filed: May 20, 2019

(65) Prior Publication Data

US 2020/0234881 A1   Jul. 23, 2020

Related U.S. Application Data

(60) Provisional application No. 62/793,747, filed on Jan. 17, 2019.

(51) Int. Cl.
*H01L 41/083*   (2006.01)
*H01G 4/12*   (2006.01)
(Continued)

(52) U.S. Cl.
CPC ......... *H01G 4/1245* (2013.01); *H01L 29/513* (2013.01); *H01L 29/516* (2013.01);
(Continued)

(58) Field of Classification Search
CPC . H01L 41/083; H01L 29/516; H01L 29/6684; H01L 29/78391
See application file for complete search history.

(56) References Cited

U.S. PATENT DOCUMENTS 5,834,882 A   11/1998   Bishop
6,020,675 A   2/2000   Yamashita et al.
(Continued)

OTHER PUBLICATIONS

R. K. Jana et al., "Transistor Switches Using Active Piezoelectric Gate Barriers," IEEE Journal on Exploratory Solid-State Computational Devices and Circuits, vol. 1, pp. 35-42, Jun. 22, 2015. (Year: 2015).*

(Continued)

*Primary Examiner* — Cuong Q Nguyen
*Assistant Examiner* — Peter M Albrecht
(74) *Attorney, Agent, or Firm* — Lewis Roca Rothgerber Christie LLP

(57) ABSTRACT

A circuit element. In some embodiments, the circuit element includes a first terminal, a second terminal, and a layered structure. The layered structure may include a first conductive layer connected to the first terminal, a first piezoelectric layer on the first conductive layer, a second piezoelectric layer on the first piezoelectric layer, and a second conductive layer connected to the second terminal. The first piezoelectric layer may have a first piezoelectric tensor and a first permittivity tensor, and the second piezoelectric layer may have a second piezoelectric tensor and a second permittivity tensor, one or both of the second piezoelectric tensor and a second permittivity tensor differing, respectively, from the first piezoelectric tensor and the first permittivity tensor.

7 Claims, 6 Drawing Sheets

(51) Int. Cl.
*H01L 29/51* (2006.01)
*H01L 29/78* (2006.01)
*H01G 4/008* (2006.01)

(52) U.S. Cl.
CPC ...... *H01L 29/517* (2013.01); *H01L 29/78391* (2014.09); *H01G 4/008* (2013.01)

(56) References Cited

U.S. PATENT DOCUMENTS

| | | | |
|---|---|---|---|
| 7,679,270 B2 | 3/2010 | Nakamura | |
| 7,723,898 B2 | 5/2010 | Wöhrle | |
| 9,722,093 B1* | 8/2017 | Xing | H01L 29/7869 |
| 9,853,150 B1* | 12/2017 | Colinge | H01L 29/40111 |
| 11,043,591 B2* | 6/2021 | Gros-Jean | H01L 29/78391 |
| 2010/0237747 A1* | 9/2010 | Axelrod | H01L 41/193 |
| | | | 310/339 |
| 2018/0006129 A1* | 1/2018 | Xing | H01L 29/42376 |
| 2018/0297079 A1 | 10/2018 | Toda | |
| 2020/0105897 A1* | 4/2020 | Hsu | H01L 29/516 |

OTHER PUBLICATIONS

R. Gupta et al., "Interfacial Charge Induced Magnetoelectric Coupling at BiFeO3/BaTiO3 Bilayer Interface," ACS Appl. Mater. Interfaces 2015, 7, 8472-8479. (Year: 2015).*

Y. F. Hou et al., "Large piezoelectric response of BiFeO3/BaTiO3 polycrystalline films induced by the low-symmetry phase," Phys. Chem. Chem. Phys., 2015, 17, 11593-11597. (Year: 2015).*

Y.-F. Hou et al., "Negative Capacitance in BaTiO3/BiFeO3 Bilayer Capacitors," ACS Appl. Mater. Interfaces 2016, 8, 22354-22360. (Year: 2016).*

* cited by examiner

FIG. 5

COMPOSITE PIEZOELECTRIC CAPACITOR

CROSS-REFERENCE TO RELATED APPLICATION(S)

The present application claims priority to and the benefit of U.S. Provisional Application No. 62/793,747, filed Jan. 17, 2019, entitled "PIEZO-ENGINEERED CAPACITANCE", the entire content of which is incorporated herein by reference.

FIELD

One or more aspects of embodiments according to the present disclosure relate to piezoelectric structures, and more particularly to a composite piezoelectric capacitor.

BACKGROUND

Capacitors are building block elements used in a large variety of circuits. Capacitors with large capacitance values may be costly to fabricate, and in some applications, the reductions or elimination of a capacitance may be advantageous.

Thus, there is a need for a configurable capacitive element.

SUMMARY

According to an embodiment of the present invention, there is provided a circuit element, including: a first terminal; a second terminal; and a layered structure, the layered structure including: a first conductive layer connected to the first terminal; a first piezoelectric layer on the first conductive layer; a second piezoelectric layer on the first piezoelectric layer; and a second conductive layer on the second piezoelectric layer, the second conductive layer being connected to the second terminal, the first piezoelectric layer having a first piezoelectric tensor and a first permittivity tensor, the second piezoelectric layer having a second piezoelectric tensor and a second permittivity tensor, the circuit element having a capacitance of less than 0.2 times the capacitance of a reference capacitor that is identical to the circuit element except for having: instead of the first piezoelectric layer, a dielectric layer having the same permittivity tensor as the first piezoelectric layer, and a zero piezoelectric tensor, and instead of the second piezoelectric layer, a dielectric layer having the same permittivity tensor as the second piezoelectric layer, and a zero piezoelectric tensor.

In some embodiments, the circuit element has a capacitance less than zero.

In some embodiments, the circuit element has a capacitance less than −0.2 times the capacitance of the reference capacitor.

In some embodiments, the first piezoelectric layer has a first thickness, and an area greater than 10 times the square of the first thickness.

In some embodiments, the circuit element further includes a dielectric layer on the first piezoelectric layer, the second piezoelectric layer being on the dielectric layer.

In some embodiments, a thickness of the first piezoelectric layer is between 10 nm and 100 nm and a thickness of the second piezoelectric layer is between 10 nm and 100 nm.

In some embodiments: the first piezoelectric layer is poled in a first direction, the first direction being within 20 degrees of a direction perpendicular to the first piezoelectric layer, and the second piezoelectric layer is poled in a second direction, the second direction being within 20 degrees of the first direction.

According to an embodiment of the present invention, there is provided a circuit element, including: a first terminal; a second terminal; and a layered structure, the layered structure including: a first conductive layer connected to the first terminal; a first piezoelectric layer on the first conductive layer; a second piezoelectric layer on the first piezoelectric layer; and a second conductive layer on the second piezoelectric layer, the second conductive layer being connected to the second terminal, the first piezoelectric layer having a first piezoelectric tensor and a first permittivity tensor, the second piezoelectric layer having a second piezoelectric tensor and a second permittivity tensor, the circuit element having a capacitance of greater than 1.2 times the capacitance of a reference capacitor that is identical to the circuit element except for having: instead of the first piezoelectric layer, a dielectric layer having the same permittivity tensor as the first piezoelectric layer, and a zero piezoelectric tensor, and instead of the second piezoelectric layer, a dielectric layer having the same permittivity tensor as the second piezoelectric layer, and a zero piezoelectric tensor.

In some embodiments, the circuit element has a capacitance greater than 1.4 times the capacitance of the reference capacitor.

In some embodiments, the first piezoelectric layer has a first thickness, and an area greater than 10 times the square of the first thickness.

In some embodiments, the circuit element further includes a dielectric layer on the first piezoelectric layer, the second piezoelectric layer being on the dielectric layer.

In some embodiments, a thickness of the first piezoelectric layer is between 10 nm and 100 nm and a thickness of the second piezoelectric layer is between 10 nm and 100 nm.

In some embodiments: the first piezoelectric layer is poled in a first direction, the first direction being within 20 degrees of a direction perpendicular to the first piezoelectric layer, and the second piezoelectric layer is poled in a second direction, the second direction being within 20 degrees of the first direction.

According to an embodiment of the present invention, there is provided a composite field effect transistor, including: a field effect transistor including a gate dielectric layer having a top surface; and a negative-capacitance piezoelectric stack, the negative-capacitance piezoelectric stack including: a first piezoelectric layer; and a second piezoelectric layer on the first piezoelectric layer, the negative-capacitance piezoelectric stack being operatively coupled to the top surface of the gate dielectric layer, and having an effective relative dielectric constant less than zero.

In some embodiments, the composite field effect transistor further includes: a first conductive layer; and a second conductive layer the first piezoelectric layer being on the first conductive layer, the second piezoelectric layer being on the first piezoelectric layer, and the second conductive layer being connected to a conductive layer on the top surface of the gate dielectric layer.

In some embodiments, the negative-capacitance piezoelectric stack is on the top surface of the gate dielectric layer.

In some embodiments, the composite field effect transistor has a subthreshold swing of less than 60 mV per decade.

In some embodiments, a thickness of the first piezoelectric layer is between 10 nm and 100 nm and a thickness of the second piezoelectric layer is between 10 nm and 100 nm.

In some embodiments: the first piezoelectric layer is poled in a first direction, the first direction being within 20 degrees of a direction perpendicular to the first piezoelectric layer, and the second piezoelectric layer is poled in a second direction, the second direction being within 20 degrees of the first direction.

In some embodiments, the negative-capacitance piezoelectric stack has an effective relative dielectric constant less than −0.2.

BRIEF DESCRIPTION OF THE DRAWINGS

These and other features and advantages of the present disclosure will be appreciated and understood with reference to the specification, claims, and appended drawings wherein:

FIG. 5 is a table of amplification values, according to an embodiment of the present disclosure.

DETAILED DESCRIPTION

The detailed description set forth below in connection with the appended drawings is intended as a description of exemplary embodiments of a composite piezoelectric capacitor provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1:
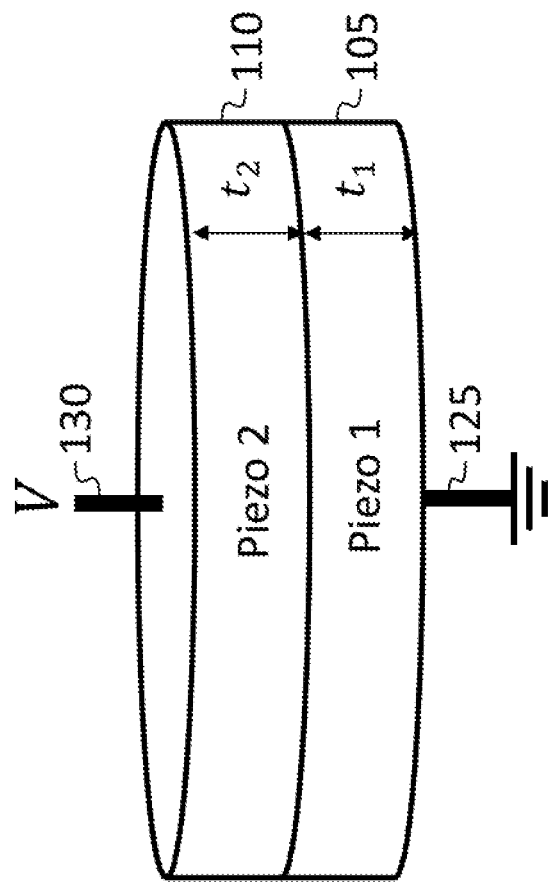
FIG. 1 is a schematic illustration of a composite piezoelectric capacitor according to an embodiment of the present disclosure.

Referring to FIG. 1, in some embodiments a composite piezoelectric capacitor includes a first piezoelectric layer 105 and a second piezoelectric layer 110. Each of the first piezoelectric layer 105 and the second piezoelectric layer 110 may be poled. The poling direction of each of the first piezoelectric layer 105 and the second piezoelectric layer 110 may be substantially perpendicular to the layers. For example, each of the first piezoelectric layer 105 and the second piezoelectric layer 110 may be poled in a direction such that an angle between the poling direction of the first piezoelectric layer 105 and the normal vector is between 0.0 degrees and 30.0 degrees (e.g., less than 20 degrees), and such that an angle between the poling direction of the second piezoelectric layer 110 and the normal vector is between 0.1 degrees and 30.0 degrees (e.g., less than 20 degrees). An angle between the poling direction of the first piezoelectric layer 105 and the poling direction of the second piezoelectric layer 110 may be between 0.0 degrees and 30.0 degrees. For example, the poling directions of the first piezoelectric layer 105 and the second piezoelectric layer 110 may be within 20 degrees of each other.

The thickness of each of the first piezoelectric layer 105 and the second piezoelectric layer 110 may be constrained by two phenomena. First, the lower limit of the piezo layer thickness may be limited to >10 nm so as to prevent polarization coupling as is may be observed in ferroelectric superlattice engineering. Second, the upper limit of the thickness of the piezo layers may be determined by the critical thickness of the materials so as to ensure that the strains are matched in both layers, i.e., less than the critical thickness, which may depend on the specific properties of the two materials. In some embodiments the upper limit of thickness of each layer may be 100 nm.

The first piezoelectric layer 105 may be on a first conductive layer 115 (FIG. 3; not shown as a separate, finite-thickness layer in FIG. 1), and a second conductive layer 120 (FIG. 3; not shown as a separate, finite-thickness layer in FIG. 1) may be on the second piezoelectric layer 110. The first conductive layer 115 may be connected to a first terminal 125 of the composite piezoelectric capacitor, and the second conductive layer 120 may be connected to a second terminal 130 of the composite piezoelectric capacitor. As such, the composite piezoelectric capacitor may be a two-terminal device, with a capacitance defined by current flowing through the terminals 125,130 and voltage across the terminals 125,130.

The behavior of each of the first piezoelectric layer 105 and the second piezoelectric layer 110 may be modeled by the following constitutive relations for a poled piezoelectric material:

$$\begin{bmatrix} \varepsilon \\ D \end{bmatrix} = \begin{bmatrix} S & d \\ d^t & \epsilon \end{bmatrix} \begin{bmatrix} \sigma \\ E \end{bmatrix},$$

where:
ε is the strain,
D is the electric displacement,
S is the compliance matrix,
d is the matrix of piezoelectric coefficients (with t denoting the transpose),
ϵ is the permittivity matrix,
σ is the stress, and
E is the electric field.

Further, a model of the behavior of the composite piezoelectric capacitor may be constructed using the following approximations and assumptions. The transverse extent of the first piezoelectric layer 105 and the second piezoelectric layer 110 may be large compared to the other dimensions (e.g., each of the first piezoelectric layer 105 and the second piezoelectric layer 110 may have an area greater than ten times the square of its thickness), and, as such, each of the first piezoelectric layer 105 and the second piezoelectric layer 110 may be approximated as an infinite slab of uniform thickness (of thickness $t_1$ and $t_2$, respectively). The first piezoelectric layer 105 and the second piezoelectric layer 110 are assumed to be composed of poled piezoelectric material, and it is assumed that the applied voltage V is much less than the coercive voltage (V<<VC) (the coercive voltage being the voltage corresponding to the minimum field capable of causing a ferroelectric domain in the piezoelectric material to flip) so that ferroelectric (FE) switching does not occur. It is further assumed that all quantities have constant values within each of the first piezoelectric layer 105 and the second piezoelectric layer 110, that there is perfect mechanical coupling between the first piezoelectric layer 105 and the second piezoelectric layer 110, so that in-plane strain is equal in the first piezoelectric layer 105 and the second piezoelectric layer 110, that there are no external stresses (e.g. from contacts or a substrate), and that there is no free charge in the stack (including at the interface).

It may further be assumed that the following boundary conditions apply, at least approximately. Based on the assumption that there are no body forces:

$$\vec{f}_b = \Omega \vec{\nabla} \cdot \sigma_{ij} = 0, \text{ which implies that:}$$

$$\frac{\partial \sigma_{zz}}{\partial z} = 0,$$

$$\frac{\partial \sigma_{yz}}{\partial z} = 0, \text{ and}$$

$$\frac{\partial \sigma_{xz}}{\partial z} = 0,$$

it may be assumed that the xz, yz and zz stresses are constant and equal to externally applied stresses in both materials, i.e., $$\sigma_{xz}^a = \sigma_{xz}^b = \sigma_{xz}^{ext},$$

$$\sigma_{yz}^a = \sigma_{yz}^b = \sigma_{yz}^{ext}, \text{ and}$$

$$\sigma_{zz}^a = \sigma_{zz}^b = \sigma_{zz}^{ext}$$

(with $\hat{z}$ being normal to the first piezoelectric layer 105 and the second piezoelectric layer 110). A further set of boundary conditions may be derived from the assumption that the strain compatibility condition is satisfied, i.e., that:

$$\frac{\partial^2 \varepsilon_{ij}}{\partial x_k \partial x_l} + \frac{\partial^2 \varepsilon_{kl}}{\partial x_i \partial x_j} = \frac{\partial^2 \varepsilon_{ik}}{\partial x_j \partial x_l} + \frac{\partial^2 \varepsilon_{jl}}{\partial x_i \partial x_k}.$$

This further set of boundary conditions may be that the xx, yy and xy strains are equal in both materials:

$$\varepsilon_{xx}^a = \varepsilon_{xx}^b = \varepsilon_{xx},$$

$$\varepsilon_{yy}^a = \varepsilon_{yy}^b = \varepsilon_{yy}, \text{ and}$$

$$\varepsilon_{xy}^a = \varepsilon_{xy}^b = \varepsilon_{xy}.$$

It may further be assumed that the $\vec{E}$ field is uniform and pointed in the z direction:

$$\vec{E} = E_z \hat{z} \text{ and}$$

$$E_x = E_y = 0,$$

that the $\vec{E}$ field integrated across the stack equals the voltage across the terminals 125, 130:

$$V = \int_{-t_1}^{t_2} E_z dz = E_z^1 t_1 + E_z^2 t_2,$$

and that $D_z$ is constant in both materials:

$$D_z^1 = D_z^2 = D_z.$$

A simulation, or numerical analysis of the model, may then be performed to predict the behavior (e.g., the capacitance) of a composite piezoelectric capacitor defined by layer thicknesses, thickness $t_1$ and $t_2$, respectively, in some embodiments.

In the numerical analysis, each material is characterized by a unique 9×9 electromechanical tensor:

$$\wp \equiv \begin{bmatrix} S & d \\ d^\dagger & \epsilon \end{bmatrix}$$

where:
S is a 6×6 compliance tensor,
c is the 3×3 permittivity tensor, and
d is the 6×3 piezoelectric tensor.

The state may be described by a 9×1 vector, representing the stress and electric field (E-field), each element of which is constant throughout the material:

$$\mathfrak{E} \equiv \begin{bmatrix} \sigma \\ E \end{bmatrix}.$$

Alternatively the state may be described by a 9×1 vector representing the strain and electric displacement (D), each element of which is constant throughout the material:

$$\mathfrak{D} \equiv \begin{bmatrix} \varepsilon \\ D \end{bmatrix}.$$

These two vectors may be related by the constitutive relations $$\mathfrak{D} = \wp \mathfrak{E},$$

where $\wp$ is the electromechanical tensor, as mentioned above.

The free surface charge $Q_{free}$ free within a volume including a portion A of the area may be given by:

$$Q_{free} = \oint D \cdot dA = D_Z A,$$

implying that $$q = \frac{Q_{free}}{A} = D_z,$$

from which it may follow that the free charge surface density, q, is given by:

$$q = D_z.$$

The total energy may be written:

$$U = \frac{t_1}{2} \mathfrak{D}^1 \cdot \mathfrak{E}^1 + \frac{t_2}{2} \mathfrak{D}^2 \cdot \mathfrak{E}^2.$$

For an applied potential, V, the solution state may then be that which minimizes the total energy constrained by the boundary conditions. This state may be found numerically, e.g., using the fmincon( ) function in Matlab. The configuration of FIG. 1 may be analyzed in cases in which the first conductive layer 115 and the second conductive layer 120 have a negligible effect (e.g., being sufficiently thin, or having sufficiently high compliance). The numerical analysis described above may readily be extended to stacks having more than two layers, (such as those of FIGS. 2-4, discussed in further detail below) by applying the mechanical and boundary conditions to each interface between layers, and adding a term for each additional layer to the equation (above) for the total energy. The stack of (piezoelectric, or piezoelectric and non-piezoelectric) layers between the first conductive layer 115 and the second conductive layer 120 may be referred to as the "piezoelectric stack".

Figure 2:
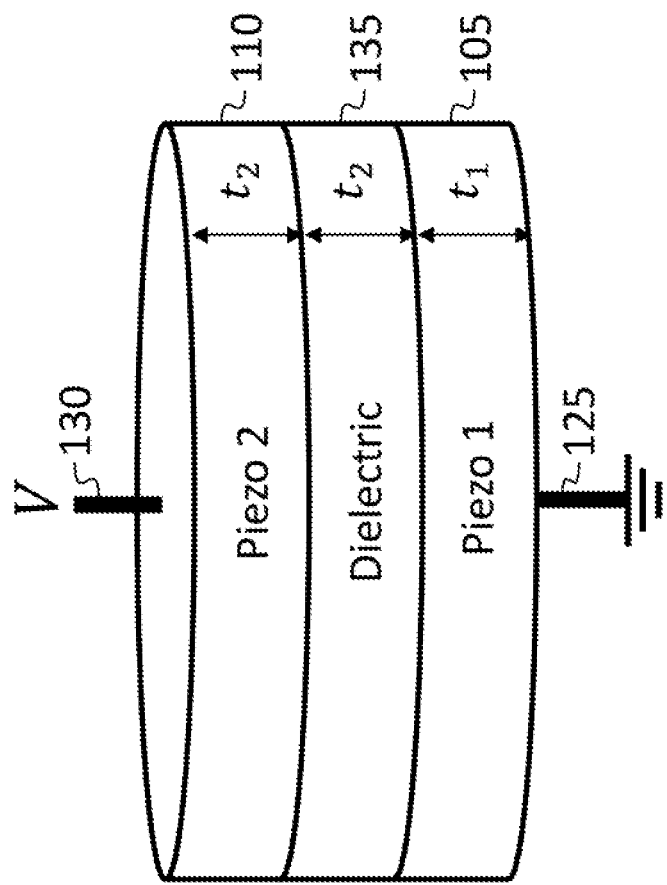
FIG. 2 is a schematic illustration of a composite piezoelectric capacitor according to an embodiment of the present disclosure.

FIG. 2 shows an embodiment in which a (non-piezoelectric) dielectric layer 135 is present between the first piezoelectric layer 105 and the second piezoelectric layer 110. The presence of the dielectric layer 135 may reduce polarization coupling effects that may occur between the first piezoelectric layer 105 and the second piezoelectric layer 110 if these layers are very thin. Such polarization coupling may result from non-uniformity in the bound charges at the interface between two non-metals. For example, when an electric field is applied across a stack including two non-metallic layers in contact with each other, a net bound charge may be formed at the interface between the two layers if the dielectric constant of the materials of the layers is not the same, because the polarization in one layer will not be equal to the polarization in the other. In the limit of thick materials, the energy associated with this polarization mismatch may be negligible, but for very thin layers (e.g., less than 20 nm), this interface energy may be significant and may fundamentally alter the response of the stack.

Figure 3:
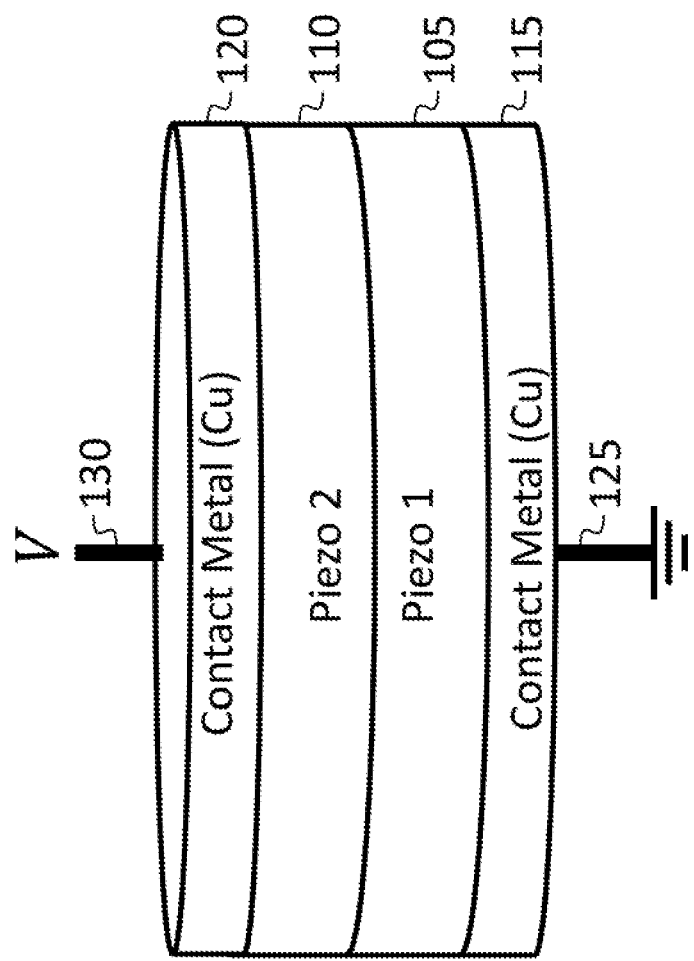
FIG. 3 is a schematic illustration of a composite piezoelectric capacitor according to an embodiment of the present disclosure.
Figure 4:
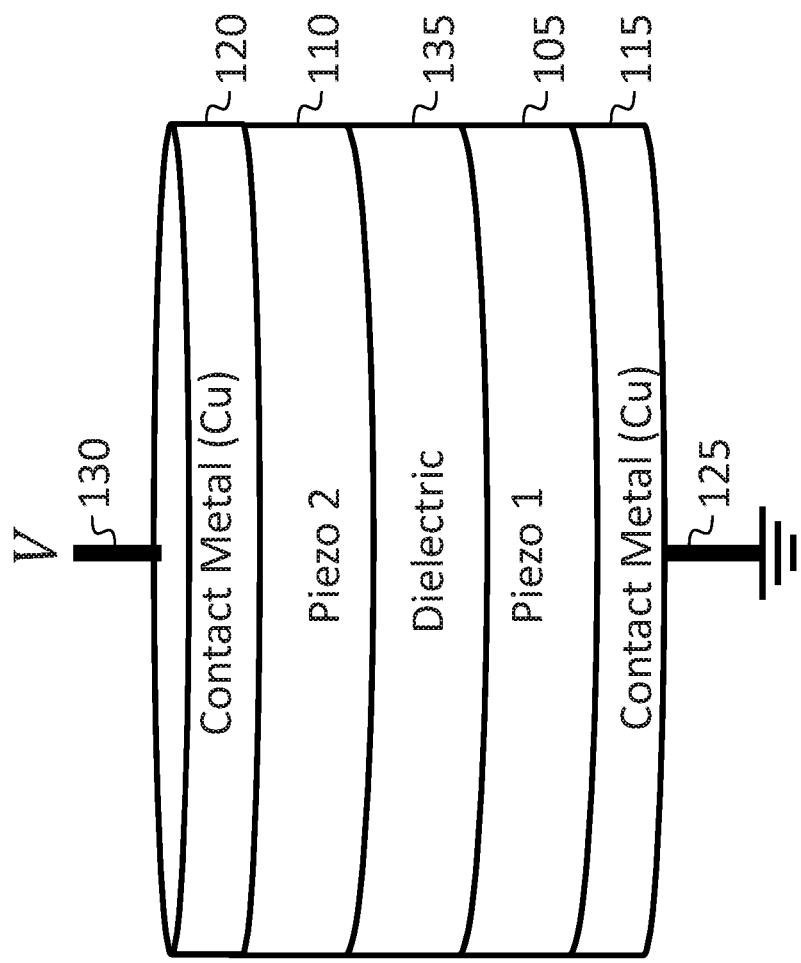
FIG. 4 is a schematic illustration of a composite piezoelectric capacitor according to an embodiment of the present disclosure.

FIG. 3 shows a composite piezoelectric capacitor with the first conductive layer 115 and second conductive layer 120 shown as having a finite physical thickness. A model based on FIG. 3 may be used to predict the behavior of a composite piezoelectric capacitor in a manner that (unlike a model based on FIG. 1) takes into account the mechanical effect of the first conductive layer 115 and second conductive layer 120. FIG. 4 shows a composite piezoelectric capacitor having a dielectric layer 135 between the first piezoelectric layer 105 and the second piezoelectric layer 110, and with the first conductive layer 115 and second conductive layer 120 shown. A model based on FIG. 4 may be used to predict the behavior of a composite piezoelectric capacitor having a dielectric layer 135 between the first piezoelectric layer 105 and the second piezoelectric layer 110, in a manner that takes into account the mechanical effect of the first conductive layer 115 and second conductive layer 120.

Figure 5:
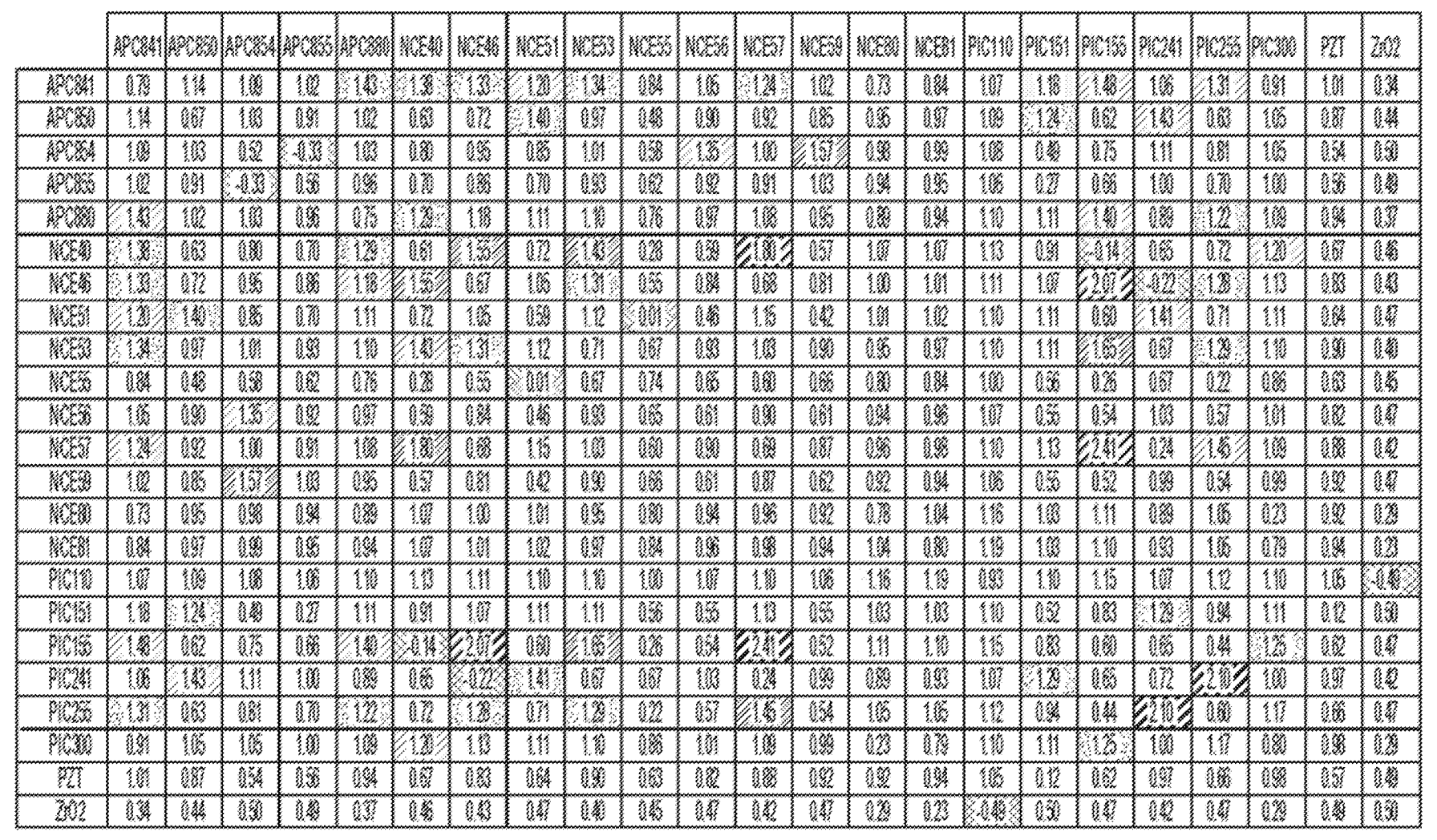

The table of FIG. 5 shows the ratio of (i) the calculated capacitance to (ii) a reference capacitance, for a composite piezoelectric capacitor according to FIG. 3, for various combinations of two piezoelectric materials (for the first piezoelectric layer 105 and the second piezoelectric layer 110, respectively). This ratio may be referred to as the "amplification" of the composite piezoelectric capacitor, and it may be represented by the symbol $\pi$:

$$\pi = \frac{c}{c_{ref}}.$$

The reference capacitance is the capacitance that a composite capacitor as in FIG. 3 would have if two non-piezoelectric dielectric materials (i.e., two dielectric materials each having a zero piezoelectric tensor) having the same permittivity tensors as the first piezoelectric layer 105 and the second piezoelectric layer 110, respectively, were substituted for the first piezoelectric layer 105 and the second piezoelectric layer 110. In the calculations that generated the values in FIG. 5, the thicknesses of the first piezoelectric layer 105 and the second piezoelectric layer 110 were assumed to be the same, and the thickness of each of first conductive layer 115 and of the second conductive layer 120 was assumed to be one tenth the thickness of the first piezoelectric layer 105. Each of first conductive layer 115 and of the second conductive layer 120 was assumed to be composed of copper.

It may be seen that the diagonal elements of the table are all less than 1.0. These diagonal elements correspond to capacitors in which the material of the first piezoelectric layer 105 is the same as the material of the second piezoelectric layer 110. The diagonal element values' being less than 1.0 may be due to a "mechanical knockdown", which refers to the reduction in capacitance that results from interaction between the piezoelectric response, the mechanical response, and the dielectric response.

It may be seen from the table of FIG. 5 that some combinations of piezoelectric materials result in a capacitance that is greater than the reference capacitance, e.g., being 1.2 times the reference capacitance or more. Further, some combinations of piezoelectric materials result in a capacitance that is significantly less than the reference capacitance, being, e.g., less than 0.1 times the reference capacitance, or even being less than zero. For example, a composite piezoelectric capacitor according to FIG. 3, in which the material of the first piezoelectric layer 105 is APC855, and the material of the second piezoelectric layer 110 is APC854, may have a capacitance this is −0.33 times the reference capacitance (i.e., a capacitance that is negative).

In some embodiments, a composite piezoelectric capacitor has three or more piezoelectric layers, and may also exhibit a capacitance not ordinarily exhibited by capacitors having a single dielectric layer, or by capacitors having dielectric layers lacking piezoelectric characteristics. As in the case of a composite piezoelectric capacitor with two piezoelectric layers, a (non-piezoelectric) dielectric layer may be present (or absent) between any adjacent pair of piezoelectric layers.

A composite piezoelectric capacitor according to some embodiments may have a variety of potentially useful characteristics. The behavior (e.g., the capacitance exhibited by the composite piezoelectric capacitor) may occur in the limit of a linear response of poled piezo materials, and it may occur with two or more different mechanically coupled piezo materials. The composite piezoelectric capacitor may not require "stabilization" (e.g., it may not be necessary to connect it in series with a conventional (positive capacitance) capacitor with matched capacitance). The characteristics of the composite piezoelectric capacitor may be hysteresis-free and not sensitive to pulse forms (e.g., in the limit that the applied field is less than the coercive field, there will be no polarization switching and therefore no hysteresis). The speed of the response of the composite piezoelectric capacitor may be limited by the piezoelectric $f_c$, (the dielectric response of the piezoelectric materials) and not by the ferroelectric switching time. In some embodiments, the capacitance of the composite piezoelectric capacitor is near zero. In some embodiments, the total capacitance of a parallel combination of capacitors, one of which is a positive-capacitance capacitor and the other of which is a negative-capacitance composite piezoelectric capacitor, may be made arbitrarily small (by selecting the capacitance values to be nearly equal and opposite). In some embodiments, the total capacitance of a series combination of capacitors, one of which is a positive-capacitance capacitor and the other of which is a negative-capacitance composite piezoelectric capacitor, may be made arbitrarily large (by selecting the capacitance values to be nearly equal and opposite).

In some embodiments a negative-capacitance composite piezoelectric capacitor may be connected in series with the gate of a field effect transistor, resulting in an increase in the capacitance of the series combination, and a reduction in the control voltage change required to effect a given change in the drain current. In some embodiments, such a configuration may be used to achieve subthreshold operation of the field effect transistor in which the composite field effect transistor (which includes a (conventional) field effect transistor, and a negative-capacitance composite piezoelectric capacitor connected in series with the gate of the field effect transistor) exhibits a subthreshold swing of less than 60 mV/decade (i.e., in which the drain current changes by more than a decade for a 60 mV change in the applied control voltage). In some embodiments, the piezoelectric layers (forming a piezoelectric stack having a negative effective relative dielectric constant) are formed directly on the gate dielectric. In other embodiments, the composite piezoelectric capacitor is fabricated as a separate structure, and is connected in series with the gate of the field effect transistor by conductors (e.g., by wires, or by conductive traces).

Figure 6:
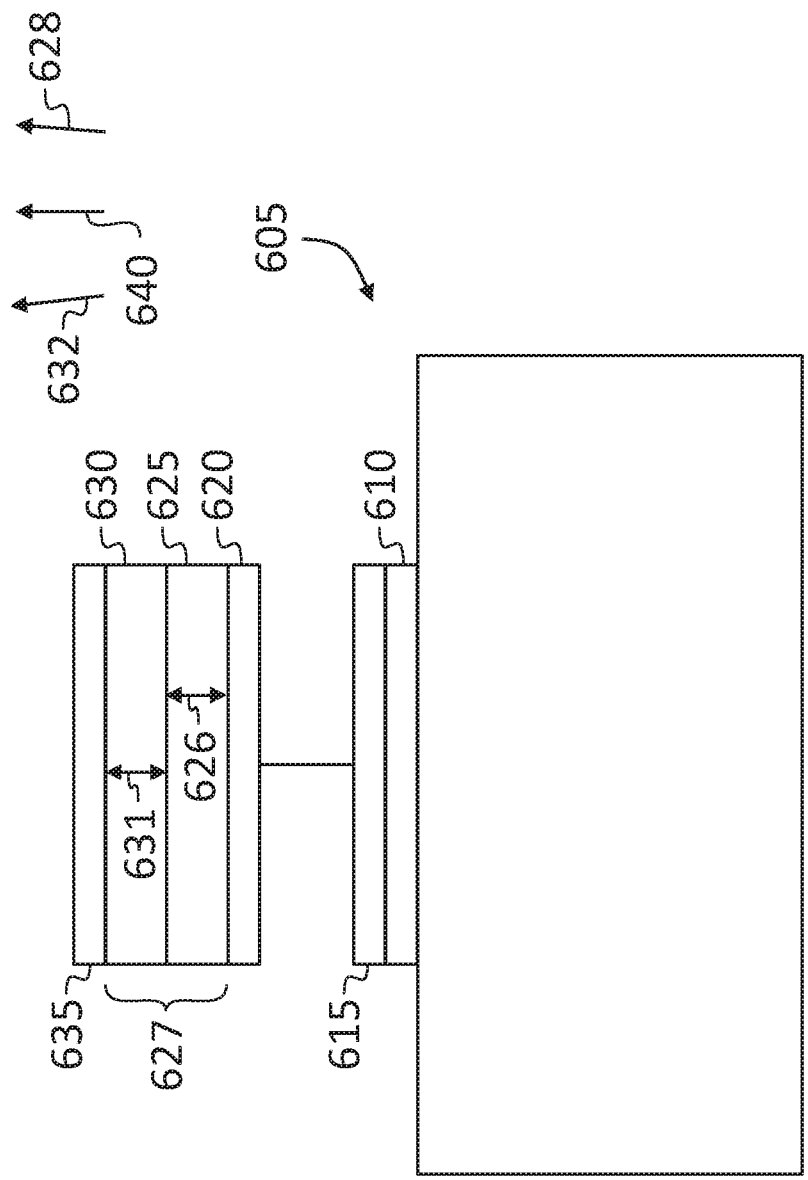
FIG. 6 is a schematic illustration of a composite field effect transistor.

For example, referring to FIG. 6, according to an embodiment of the present invention, there is provided a composite field effect transistor, including: a field effect transistor 605 including a gate dielectric layer 610 having a top surface; and a negative-capacitance piezoelectric stack 627, the negative-capacitance piezoelectric stack 627 including: a first piezoelectric layer 630; and a second piezoelectric layer 625 on the first piezoelectric layer 630, the negative-capacitance piezoelectric stack 627 being operatively coupled to the top surface of the gate dielectric layer 610, and having an effective relative dielectric constant less than zero.

In some embodiments, the composite field effect transistor further includes: a first conductive layer 635; and a second conductive layer 620, the first piezoelectric layer 630 being on the first conductive layer 635, the second piezoelectric layer 625 being on the first piezoelectric layer 630, and the second conductive layer 620 being connected to a conductive layer 615 on the top surface of the gate dielectric layer 610.

In some embodiments, a thickness 631 of the first piezoelectric layer 630 is between 10 nm and 100 nm and a thickness 626 of the second piezoelectric layer 625 is between 10 nm and 100 nm.

In some embodiments: the first piezoelectric layer 630 is poled in a first direction 632, the first direction 632 being within 20 degrees of a direction 640 perpendicular to the first piezoelectric layer 630, and the second piezoelectric layer 625 is poled in a second direction 628, the second direction 628 being within 20 degrees of the first direction 632.

As used herein, the "effective relative dielectric constant" of a piezoelectric stack of layers (e.g., of a stack including at least two dissimilar piezoelectric layers) is the ratio of (i) the capacitance of a capacitor including the piezoelectric stack between two conductive layers and (ii) the capacitance of an otherwise identical capacitor having no dielectric (i.e., vacuum, or, approximately, air), instead of the piezoelectric stack, between the two conductive layers. As such, the effective relative dielectric constant may depend on the composition of the piezoelectric stack, and also on any mechanical constraints to which it is subjected (e.g., by the two conductive layers).

Other applications for a composite piezoelectric capacitor, or for a piezoelectric stack, include ultra high-k capacitors, ultra low-k materials, compact inductive-like passive electronic components, and unipolar complementary logic. For example, unipolar complementary logic may be formed by combining, in a single circuit, (i) a first plurality of conventional field effect transistors having a first channel polarity (e.g., n-channel field effect transistors or p-channel transistors) with (ii) a second plurality of field effect transistors each having the same channel polarity as that of the first plurality of conventional field effect transistors and each having a negative-capacitance composite piezoelectric capacitor connected in series with the gate. Each of the negative-capacitance composite piezoelectric capacitors may have a capacitance that is negative and the absolute value of which is smaller than the gate capacitance of the transistor to which it is connected, so that the total capacitance of the series combination is negative (and so that a control voltage applied to the series combination results in a current flow into (or out of) the gate that is in the opposite direction to what it would be were the negative-capacitance composite piezoelectric capacitor absent).

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" refers to a component that is present in a composition, polymer, or product in an amount greater than an amount of any other single component in the composition or product. In contrast, the term "primary component" refers to a component that makes up at least 50% by weight or more of the composition, polymer, or product. As used herein, the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

In some embodiments, the numerical analysis used to predict characteristics of a composite piezoelectric capacitor may be performed with a processing circuit. The term "processing circuit" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example a processing circuit may include two processing circuits, an FPGA and a CPU, interconnected on a PCB.

Although exemplary embodiments of a composite piezoelectric capacitor have been specifically described and illustrated herein, many modifications and variations will be apparent to those skilled in the art. Accordingly, it is to be understood that a composite piezoelectric capacitor constructed according to principles of this disclosure may be embodied other than as specifically described herein. The invention is also defined in the following claims, and equivalents thereof.

What is claimed is:

1. A composite field effect transistor, comprising:
    a field effect transistor comprising a gate dielectric layer having a top surface;
    a negative-capacitance piezoelectric stack; and
    a conductive layer interposed between the gate dielectric layer and the negative-capacitance piezoelectric stack,
    the negative-capacitance piezoelectric stack comprising:
        a first piezoelectric layer;
        a non-piezoelectric layer, on the first piezoelectric layer; and
        a second piezoelectric layer on the non-piezoelectric layer,
        the non-piezoelectric layer being interposed between the first piezoelectric layer and the second piezoelectric layer,
    the first piezoelectric layer being composed of a first piezoelectric material;
    the second piezoelectric layer being composed of a second piezoelectric material, different from the first piezoelectric layer; and
    the negative-capacitance piezoelectric stack being operatively coupled to the top surface of the gate dielectric layer, and having an effective relative dielectric constant less than zero as a result of differences between the respective properties of the first piezoelectric material and the second piezoelectric material.

2. The composite field effect transistor of claim 1, further comprising:
    a first conductive layer; and
    a second conductive layer,
    the first piezoelectric layer being on the first conductive layer,
    the second piezoelectric layer being on the first piezoelectric layer, and
    the second conductive layer being connected to the conductive layer on the top surface of the gate dielectric layer.

3. The composite field effect transistor of claim 1, wherein the negative-capacitance piezoelectric stack is on the top surface of the gate dielectric layer.

4. The composite field effect transistor of claim 1, wherein the composite field effect transistor has a subthreshold swing of less than 60 mV per decade.

5. The composite field effect transistor of claim 1, wherein a thickness of the first piezoelectric layer is between 10 nm and 100 nm and a thickness of the second piezoelectric layer is between 10 nm and 100 nm.

6. The composite field effect transistor of claim 1, wherein:
    the first piezoelectric layer is poled in a first direction, the first direction being within 20 degrees of a direction perpendicular to a top surface of the first piezoelectric layer, and the second piezoelectric layer is poled in a second direction, the second direction being within 20 degrees of the first direction.

7. The composite field effect transistor of claim 1, wherein the negative-capacitance piezoelectric stack has an effective relative dielectric constant less than −0.2.

\* \* \* \* \*